(12) United States Patent
Liu et al.

(10) Patent No.: US 10,971,497 B2
(45) Date of Patent: Apr. 6, 2021

(54) MEMORY CELL

(71) Applicants: UNITED MICROELECTRONICS CORP., Hsin-Chu (TW); Fujian Jinhua Integrated Circuit Co., Ltd., Quanzhou (CN)

(72) Inventors: Hong-Ru Liu, Chiayi County (TW); Kuei-Hsuan Yu, New Taipei (TW)

(73) Assignees: UNITED MICROELECTRONICS CORP., Hsin-Chu (TW); Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

(21) Appl. No.: 15/867,615

(22) Filed: Jan. 10, 2018

(65) Prior Publication Data

US 2019/0189618 A1      Jun. 20, 2019

(30) Foreign Application Priority Data

Dec. 14, 2017  (CN) .......................... 201711337456.7

(51) Int. Cl.
*H01L 27/108* (2006.01)
*H01L 21/3065* (2006.01)
(Continued)

(52) U.S. Cl.
CPC .. *H01L 27/10823* (2013.01); *H01L 27/10814* (2013.01); *H01L 27/10817* (2013.01);
(Continued)

(58) Field of Classification Search
CPC ......... H01L 27/10808; H01L 27/10814; H01L 27/10823; H01L 27/10852;
(Continued)

(56) References Cited

U.S. PATENT DOCUMENTS

| | | | | | |
|---|---|---|---|---|---|
| 4,797,721 A | * | 1/1989 | Hsu | ................... | H01L 29/78609 257/354 |
| 5,404,038 A | * | 4/1995 | Morihara | .......... | H01L 27/10823 257/329 |
| 5,840,591 A | * | 11/1998 | Park | .................. | H01L 27/10805 438/262 |
| 6,127,228 A | * | 10/2000 | Lee | ................... | H01L 21/76897 257/E21.507 |

(Continued)

FOREIGN PATENT DOCUMENTS

CN        1933160 A       3/2007
CN      101673744 A       3/2010

OTHER PUBLICATIONS

Lin, Title of Invention: Semiconductor Device and Fabrication Method Thereof, U.S. Appl. No. 15/296,922, filed Oct. 18, 2016.

*Primary Examiner* — Cuong Q Nguyen
*Assistant Examiner* — Peter M Albrecht
(74) *Attorney, Agent, or Firm* — Winston Hsu

(57) ABSTRACT

A memory cell includes a curved gate channel transistor, a buried bit line, a word line and a capacitor. The curved gate channel transistor has a first doped region located in a substrate, a second doped region and a third doped region located on the substrate, wherein the second doped region is directly on the first doped region and the third doped region is right next to the second doped region, thereby constituting a curved gate channel. The buried bit line is located below the first doped region. The word line covers the second doped region. The capacitor is located above the curved gate channel transistor and in electrical contact with the third doped region. The present invention also provides a memory cell having a vertical gate channel transistor, and the vertical gate channel has current flowing downward.

12 Claims, 8 Drawing Sheets

(51) Int. Cl.
*H01L 29/78* (2006.01)
*H01L 29/423* (2006.01)

(52) U.S. Cl.
CPC .. *H01L 27/10852* (2013.01); *H01L 27/10855* (2013.01); *H01L 27/10876* (2013.01); *H01L 27/10885* (2013.01); *H01L 27/10888* (2013.01); *H01L 27/10891* (2013.01); *H01L 21/3065* (2013.01); *H01L 29/42376* (2013.01); *H01L 29/7827* (2013.01)

(58) Field of Classification Search
CPC ......... H01L 27/10855; H01L 27/10876; H01L 29/1037; H01L 29/41741; H01L 29/66666; H01L 29/7827; H01L 29/78642
See application file for complete search history.

(56) References Cited

U.S. PATENT DOCUMENTS

| | | | |
|---|---|---|---|
| 6,890,812 B2 | 5/2005 | Forbes | |
| 8,304,818 B2 | 11/2012 | Forbes | |
| 9,698,261 B2 | 7/2017 | Wang | |
| 2001/0021122 A1* | 9/2001 | Kurth | G11C 11/005 365/149 |
| 2005/0032304 A1* | 2/2005 | Park | H01L 21/31116 438/253 |
| 2006/0244024 A1 | 11/2006 | Manger | |
| 2007/0018206 A1* | 1/2007 | Forbes | H01L 27/10876 257/288 |
| 2009/0224311 A1* | 9/2009 | Hashitani | H01L 29/1037 257/330 |
| 2011/0111568 A1* | 5/2011 | Kim | H01L 29/0657 438/268 |

\* cited by examiner

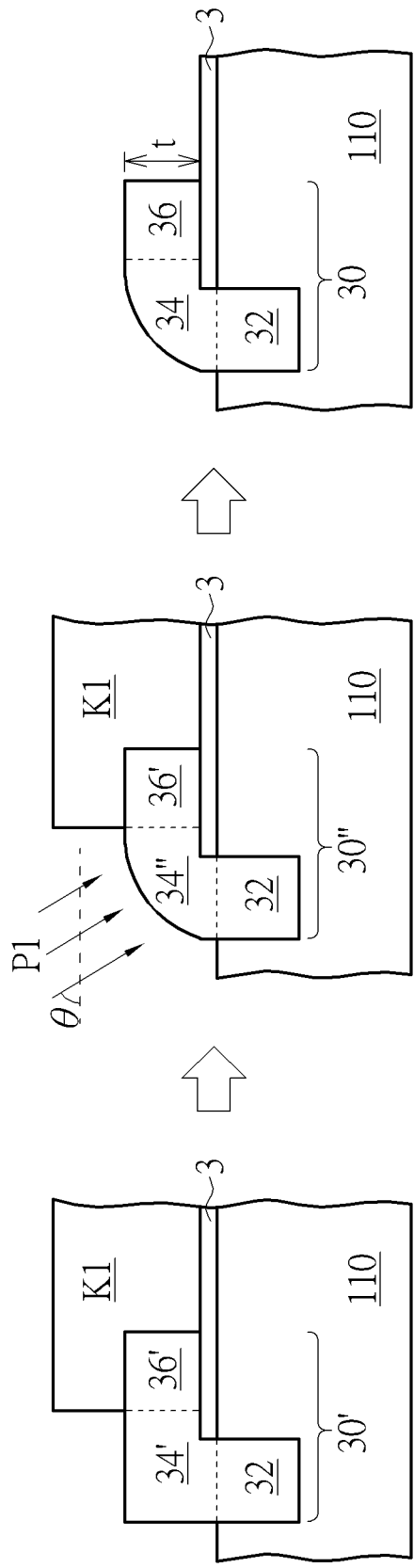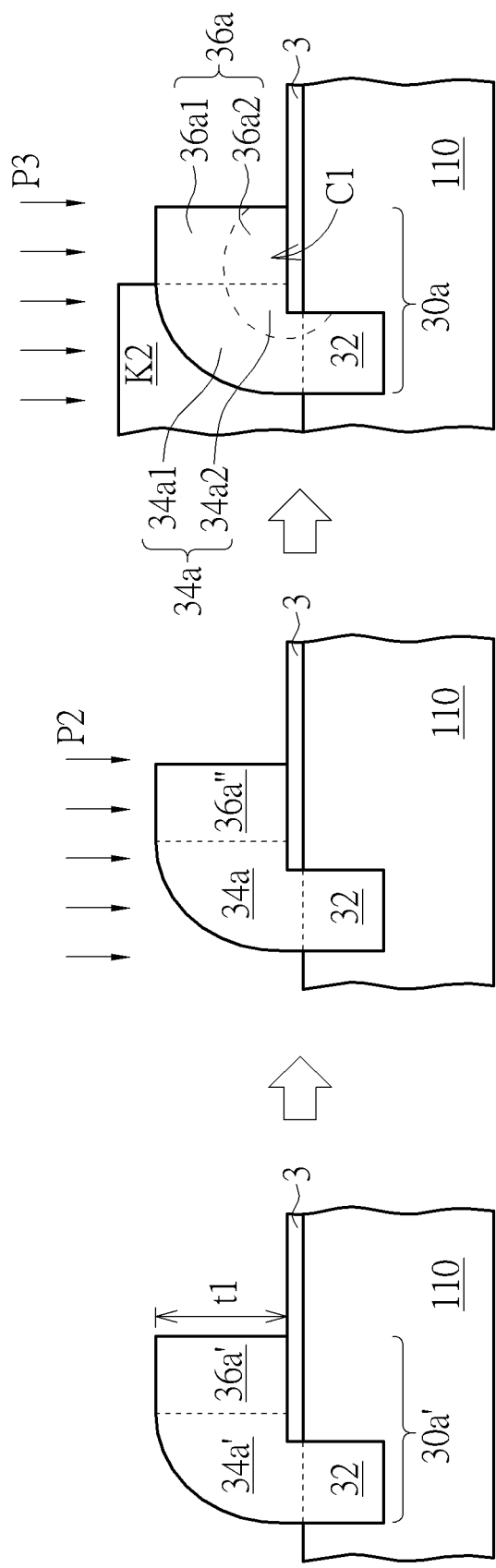
FIG. 2
FIG. 3

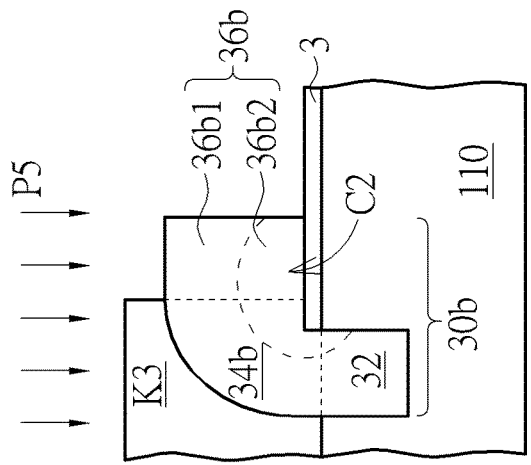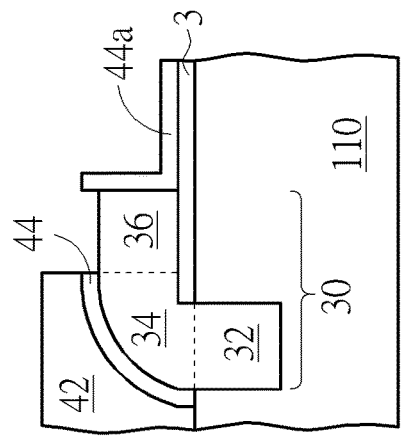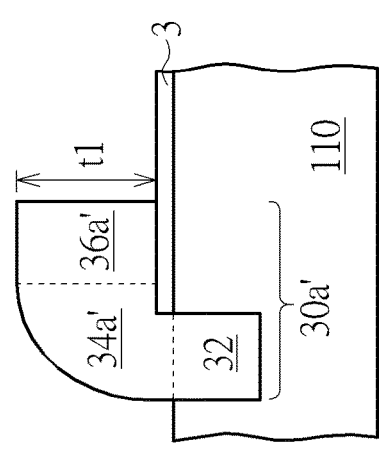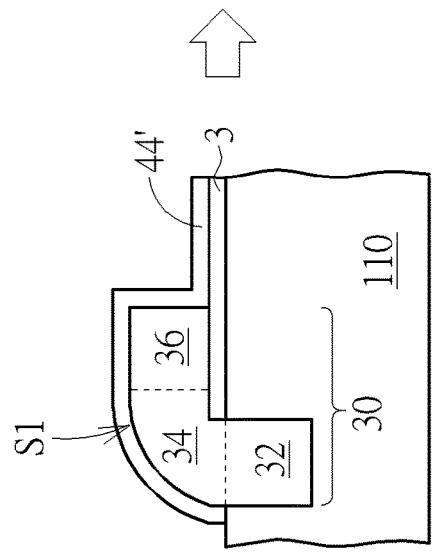
FIG. 4
FIG. 5

MEMORY CELL

BACKGROUND OF THE INVENTION

1. Field of the Invention

The present invention relates generally to a memory cell, and more specifically to a memory cell including a curved gate channel or a vertical gate channel.

2. Description of the Prior Art

Random access memory (RAM) can be operated to read data from it and write data into it. As computers containing RAM turn off, data disappears from the RAM immediately. Since data in RAM can be altered easily, RAM is widely used as temporary data storage memory in personal computers. RAM can be classified into dynamic-type and static-type.

A static random access memory (SRAM: Static RAM) stores one-bit data by six transistors, and electricity is not needed during operating to keep this data, thus called Static RAM. Static RAM is a complex structure, therefore having high access speed and high cost, thereby it is often used as a memory providing low capacity but high speed such as a 256 KB or 512 KB cache memory built-in a central processing unit (CPU) of a personal computer.

A dynamic random access memory (DRAM: Dynamic RAM) stores one-bit data by one transistor paired with one capacitor, and electricity must be supported during operating to keep this data, thus called Dynamic RAM. Dynamic RAM is a simple structure, therefore having slow access speed and low cost. Thus, it is often used as a memory providing high capacity but low speed such as a main memory of a personal computer.

SUMMARY OF THE INVENTION

The present invention provides a memory cell including a curved gate channel transistor or a vertical gate channel transistor, to make process easier and structure more stable.

The present invention provides a memory cell including a curved gate channel transistor, a buried bit line, a word line and a capacitor. The curved gate channel transistor has a first doped region located in a substrate, a second doped region and a third doped region located on the substrate, wherein the second doped region is directly on the first doped region and the third doped region is right next to the second doped region, thereby constituting a curved gate channel. The buried bit line is located below the first doped region. The word line covers the second doped region. The capacitor is located above the curved gate channel transistor and is in electrical contact with the third doped region.

The present invention provides a memory cell including a vertical gate channel transistor, a bit line, a word line and a capacitor. The vertical gate channel transistor has a third doped region, a second doped region and a first doped region stacked from bottom to top, thereby constituting a vertical gate channel. The bit line is located above the vertical gate channel transistor and in electrical contact with the first doped region. The word line is located on at least a sidewall of the second doped region. The capacitor is located beside the vertical gate channel transistor and in electrical contact with the third doped region, thereby the vertical gate channel having current flowing downward.

According to the above, the present invention provides a memory cell including a curved gate channel transistor, which includes a first doped region disposed in a substrate, s second doped region and a third doped region disposed on the substrate, thereby constituting a curved gate channel, and then a word line coving the second doped region. In this way, processes are simplified due to the doped regions and the word line can being formed easily. The word line directly covering the second doped region can improve the coverage of the word line covering the second doped region and the ability of the word line to control the curved gate channel. Besides, the memory cell of the present invention has a more stable structure, which can prevent the structure from being damaged caused by the collapse of a vertical structure.

The present invention provides a memory cell including a vertical gate channel transistor including a third doped region, a second doped region and a first doped region from bottom to top, thereby constituting a vertical gate channel. Since a bit line is disposed above a vertical gate channel transistor and in electrical contact with the first doped region, and a capacitor is disposed next to the vertical gate channel transistor and is in electrical contact with the third doped region, the vertical gate channel has a current flowing downward. By doing this, the memory cell has a more stable structure, which can reduce the structure damage caused by vertical structural collapse. Besides, the memory cell of the present invention can save space and improve the performance of the memory cell.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 schematically depicts a cross-sectional view of a method of forming a part of a memory cell according to an embodiment of the present invention.

FIG. 3 schematically depicts a cross-sectional view of a method of forming a curved gate channel according to an embodiment of the present invention.

FIG. 4 schematically depicts a cross-sectional view of a method of forming a curved gate channel according to another embodiment of the present invention.

FIG. 5 schematically depicts a cross-sectional view of a method of forming a part of a memory cell according to an embodiment of the present invention.

DETAILED DESCRIPTION

Figure 1:
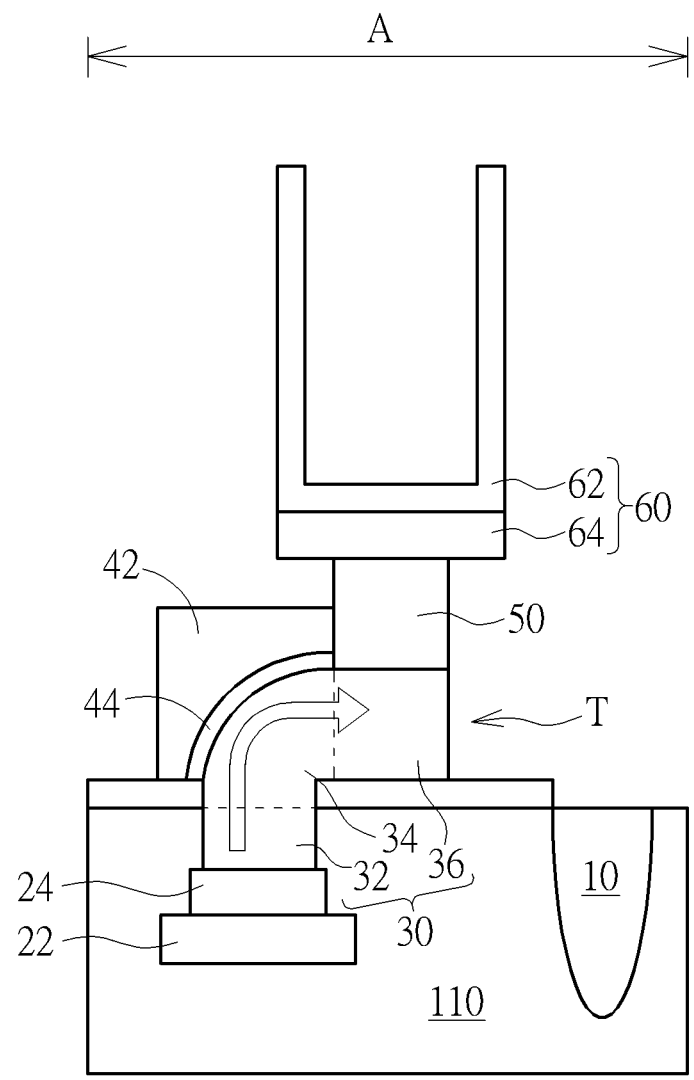
FIG. 1 schematically depicts a cross-sectional view of a memory cell according to an embodiment of the present invention.

FIG. 1 schematically depicts a cross-sectional view of a memory cell according to an embodiment of the present invention. As shown in FIG. 1, a substrate 110 may be a semiconductor substrate such as a silicon substrate, a silicon containing substrate, a III-V group-on-silicon (such as GaN-on-silicon) substrate, a graphene-on-silicon substrate, a silicon-on-insulator (SOI) substrate or a substrate containing epitaxial layers. Only an active area A of the substrate 110 is depicted, and an isolation structure 10 isolates the active area A from other areas. The isolation structure 10 may include a shallow trench isolation (STI) structure, which may be a shallow trench isolation (STI) process, but it is not limited thereto.

A buried bit line 22 and a bit line contact 24 may be formed in the substrate 110 by methods such as dual damascene or deposition etc. The buried bit line 22 and the bit line contact 24 may be formed by metals such as copper, aluminum or etc, and the buried bit line 22 and the bit line contact 24 may have common or different conductive materials.

A first doped region 32 is disposed in the substrate 110, and a second doped region 34 and a third doped region 36 are disposed on the substrate 110, wherein the bit line contact 24 physically connects the buried bit line 22 with the first doped region 32. Thus, the second doped region 34 is directly on the first doped region 32, and the third doped region 36 is located next to the second doped region 34, thereby constituting a curved gate channel 30. A word line 42 covers the second doped region 34, and a gate dielectric layer 44 is formed between the second doped region 34 and the word line 42. A dielectric layer 3 isolates the third doped region 36 and the word line 42 from the substrate 110.

Methods of forming the first doped region 32, the second doped region 34, the third doped region 36, the word line 42 and the gate dielectric layer 44 may include the following, but it is not limited thereto.

FIG. 2 schematically depicts a cross-sectional view of a method of forming a part of a memory cell according to an embodiment of the present invention. As shown in the left diagram of FIG. 2, the dielectric layer 3 may be formed by covering and patterning to cover the substrate 110 but expose the part of the substrate 110 for forming the first doped region 32. Thus, a doped process is performed to form the first doped region 32. In this case, the first doped region 32 has a first conductive type, for example an N-type. Then, a second doped region 34' may be formed on the first doped region 32, and a third doped region 36' may be formed beside the second doped region 34' and on the dielectric layer 3 by epitaxy processes or deposition processes. Thereby, a curved gate channel 30' having a tip corner is formed.

A patterned photoresist K1 may be formed by covering and patterning to cover the substrate 110 and the third doped region 36' but expose the second doped region 34'. As shown in the middle diagram of FIG. 2, an etching process P1 is performed to curve the second doped region 34' and thus to form a second doped region 34'. The etching process P1 may include multistep dry etching process, and the etching process P1 preferably has an etching angle θ for etching the second doped region 34' at a specific direction and thus curving the second doped region 34'. In this way, the first doped region 32, the second doped region 34" and the third doped region 36' constitute a curved gate channel 30". As shown in the right diagram of FIG. 2, doped processes are performed respectively to from the second doped region 34" having a second conductive type and the third doped region 36' having a first conductive type, and then the patterned photoresist K1 is removed. Therefore, the curved gate channel 30 is formed, and the second doped region 34 and the third doped region 36 have a thickness t. In this embodiment, a doped process is performed to form the second doped region 34" having the second conductive type such as P-type, the patterned photoresist K1 is removed, covering a mask such as a photoresist but exposing the third doped region 36', a doped process is performed to form the third doped region 36' having the first conductive type such as N-type, and then the mask is removed, but it is not limited thereto.

Two methods of forming the curved gate channel are presented in the following. As shown in the left diagram of FIG. 3, the dielectric layer 3 may be formed by covering and then patterning, to cover the substrate 110 but expose the part of the substrate 110 for forming the first doped region 32. A doped process is performed to form the first doped region 32. In this case, the first doped region 32 has the first conductive type, for example N-type. Then, a second doped region 34a' and a third doped region 36a' are formed on the first doped region 32 by processes such as epitaxy processes or deposition processes etc. In this case, methods of forming the curved second doped region 34a' can be shown in the middle diagram of FIG. 2, and are not described again. Thus, a curved gate channel 30a' having a tip corner is formed. In this case, the second doped region 34a' and the third doped region 36a' are thickened, therefore a thickness t1 of the second doped region 34a' and the third doped region 36a' is larger than the thickness t of the second doped region 34a and the third doped region 36a. As shown in the middle diagram of FIG. 3, a doped process P2 is performed to form the second doped region 34a and a third doped region 36a", wherein both of the second doped region 34a and the third doped region 36a" have the second conductive type, for example P-type. As shown in the right diagram of FIG. 3, a patterned photoresist K2 is formed to cover the second doped region 34a, and then a doped process P3 is performed to form a third doped region 36a and preserve the second doped region 34a, wherein the second doped region 34a has the second conductive type, for example P-type while the third doped region 36a has the first conductive type, for example N-type.

More precisely, only an upper part 34a1 of the second doped region 34a and an upper part 36a1 of the third doped region 36a are doped by the doped process P2 and the doped process P3 due to the thickened second doped region 34a and the thickened third doped region 36a, leading to the upper part 34a1 and the upper part 36a1 having the second conductive type while a lower part 34a2 of the second doped region 34a and a lower part 36a2 of the third doped region 36a are un-doped parts. By doing this, a curved part C1 of the lower part of a curved gate channel 30a constituted by the first doped region 32, the second doped region 34a and the third doped region 36a can be prevented from having circuit leakage.

In another embodiment, the step of the left diagram of FIG. 4 is common to the step of the left diagram of FIG. 3, and then as shown in the step of the middle diagram of FIG. 4, a doped process P4 may be selectively performed (which may has the dopant concentration and the dopant depth common to the middle diagram of FIG. 3 or has the dopant concentration and the dopant depth larger than the middle diagram of FIG. 3) to form a second doped region 34b and a third doped region 36b' having the second conductive type, for example P-type. Thereafter, as shown in the right diagram of FIG. 3, a patterned photoresist K3 is formed to cover the second doped region 34b. A doped process P5 may be performed to form a third doped region 36b while preserve the second doped region 34b, thereby the third doped region 36b having the first conductive type, for example N-type, and the second doped region 34b having the second conductive type, for example P-type. In a preferred embodiment, the doped process P5 may be a plasma doped process, and the doped process P5 may only dope a surface of the third doped region 36b, but it is not limited thereto.

Since the second doped region 34b and the third doped region 36b' are thickened and the doped process P5 is a plasma doped process, the doped process P5 can only dope an upper part 36b1 of the third doped region 36b, thereby the upper part 36b1 having the first conductive type while a lower part 36b2 of the third doped region 36b having the second conductive type. By doing this, a curved part C2 of the lower part of a curved gate channel 30b constituted by the first doped region 32, the second doped region 34a and the third doped region 36a can be prevented from having circuit leakage.

After the step of the right diagram of FIG. 2 (the first doped region 32, the second doped region 34 and the third doped region 36 are formed), a gate dielectric layer 44 and a word line 42 are formed. As shown in the step of the left diagram of FIG. 5, a gate dielectric layer 44' may be formed to entirely cover the second doped region 34, the third doped region 36 and the dielectric layer 3. The gate dielectric layer 44' may be a dielectric layer such as an oxide layer or a dielectric layer having a high dielectric constant etc. Due to the second doped region 34 having a curved surface S1, the gate dielectric layer 44' is also a curved layer. As shown in the step of the middle diagram of FIG. 5, the word line 42 only covers the gate dielectric layer 44' right above the second doped region 34. As shown in the step of the right diagram of FIG. 5, the gate dielectric layer 44' right above the third doped region 36 is removed by processes such as an etching process, and the third doped region 36 is therefore exposed. Therefore, the gate dielectric layer 44 between the second doped region 34 and the word line 42 is formed, wherein the interfaces between the second doped region 34 and the word line 42 are curved surfaces. A gate dielectric layer 44a covering the dielectric layer 3 and a sidewall of the third doped region 36 may be optionally removed in later processes.

It is emphasized that, the gate channel of the present invention is formed along the substrate by the doped processes and the word line can blanketly cover the gate channel, so that processes of the present invention can be easier and the coverage of the word line to the gate channel can be better and the ability of the word line controlling the gate channel can be improved.

Please refer to FIG. 1 again, a storage node contact 50 is formed on the third doped region 36. The storage node contact 50 may be metals such as copper or other conductive materials. Then, a capacitor 60 is formed on the storage node contact 50, therefore the capacitor 60 can being disposed above a transistor T including the curved gate channel 30 and is in electrical contact with the third doped region 36, wherein the storage node contact 50 physically connects the capacitor 60 with the third doped region 36. More precisely, the capacitor 60 may include a storage node 62 and a storage node pad 64, and the storage node pad 64 electrically connects the storage node 62 with the storage node contact 50. In this case, the word line 42 directly contacts the storage node contact 50, but it is not limited thereto. In another embodiment, the word line 42 may be isolated from the storage node contact 50 by dielectric layers.

Accordingly, the memory cell of the present invention includes a transistor including a curved gate channel disposed directly on the substrate, meaning the curved gate channel of the transistor being disposed along the substrate. Compared to a memory cell having a vertical gate channel, the structure of the memory cell of the present invention can be more stable, the structure damage caused by vertical structure collapse can be avoided. Besides, the memory cell of the present invention can save space and improve the performance of the memory cell.

Figure 6:
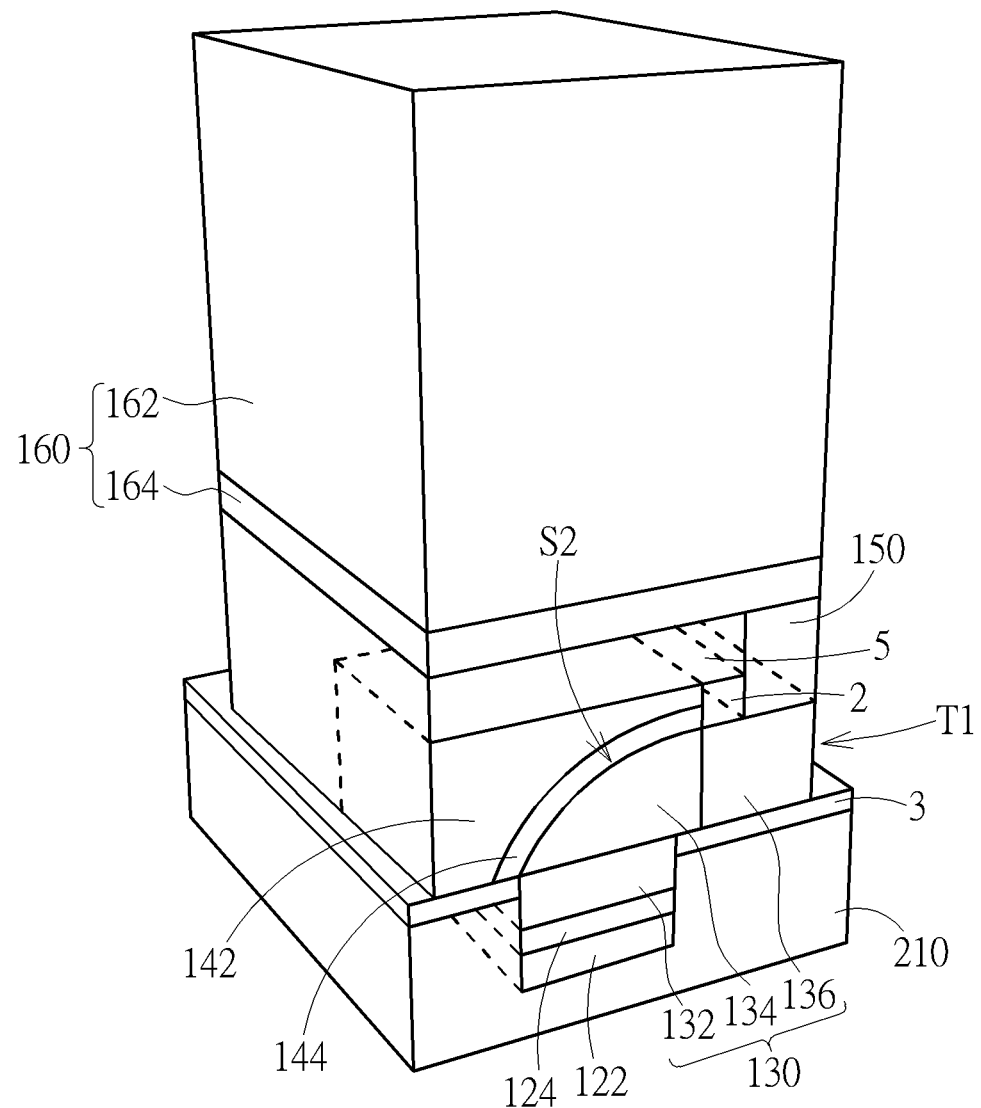
FIG. 6 schematically depicts a three-dimensional diagram of a memory cell according to an embodiment of the present invention.

For clarifying the memory cell of the present invention including the transistor including the curved gate channel, FIG. 6 schematically depicts a three-dimensional diagram of a memory cell according to an embodiment of the present invention. As shown in FIG. 6, a transistor T1 having a curved gate channel is provided. The transistor T1 includes a first doped region 132 disposed in a substrate 210, and a second doped region 134 and a third doped region 136 disposed on the substrate 210. The second doped region 134 is directly disposed above the first doped region 132, and the third doped region 136 is disposed beside the second doped region 134, thereby constituting a curved gate channel 130. In this embodiment, the second doped region 134 has a curved surface S2. A buried bit line 122 is disposed below the first doped region 132 and is in electrical contact with the first doped region 132. A bit line contact 124 is between the first doped region 132 and the buried bit line 122, and physically connects the first doped region 132 and the buried bit line 122. A word line 142 covers the second doped region 134. A gate dielectric layer 144 is located between the second doped region 134 and the word line 142, therefore the gate dielectric layer 144 being a curved layer, and the interfaces between the second doped region 134 and the word line 142 are curved surfaces. A dielectric layer 3 covers the substrate 210, the dielectric layer 3 is between the substrate 210 and the third doped region 136, and is between the substrate 210 and the word line 142 for electrically isolating the substrate 210 form the third doped region 136, and electrically isolating the substrate 210 from the word line 142.

A storage node contact 150 is directly above the third doped region 136. An isolation layer 2 is between the word line 142 and the storage node contact 150 for electrically isolating the word line 142 from the storage node contact 150. An isolation layer 5 entirely covers the word line 142 and a top surface of the isolation layer 5 is trimmed with a top surface of the storage node contact 150, enabling a capacitor can being disposed above the isolation layer 5 and the storage node contact 150 stably. A capacitor 160 is entirely disposed on the isolation layer 5 and the storage node contact 150, and the capacitor 160 is electrically connected to the third doped region 136 by the storage node contact 150. The capacitor 160 may include a storage node 162 and a storage node pad 164, wherein the storage node pad 164 electrically connects the storage node 162 with the storage node contact 150. In a preferred embodiment, the capacitor 160 entirely covers the space right above the transistor T1 including the curved gate channel and the capacitor 160 has a volume as large as possible, but it is not limited thereto.

Figure 7:
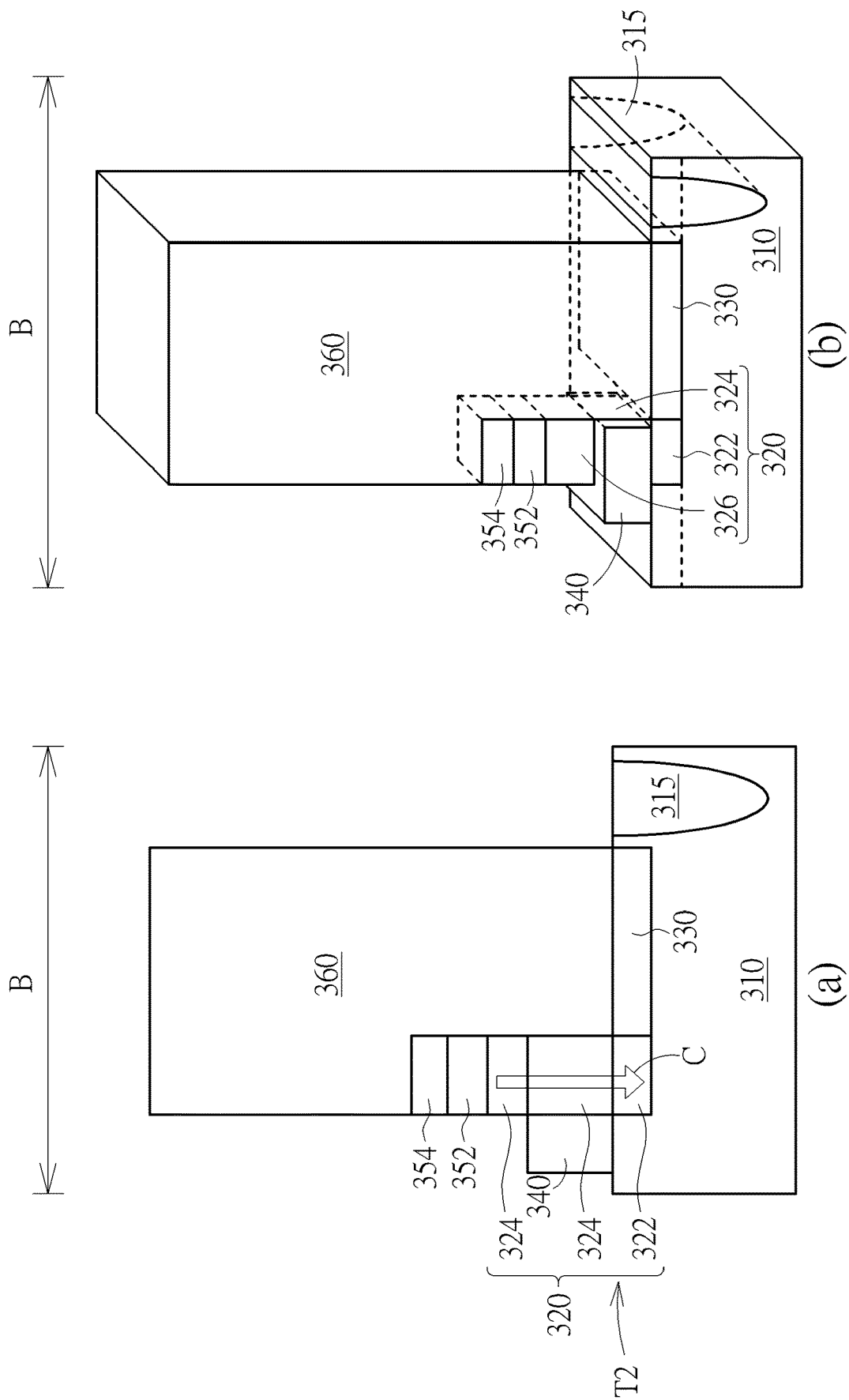
FIG. 7 schematically depicts a cross-sectional view and a three-dimensional diagram of a memory cell according to an embodiment of the present invention.

A memory cell of the present invention including a transistor including a curved gate channel is presented above, and then a memory cell of the present invention including a transistor including a vertical gate channel is presented as follows. FIG. 7 schematically depicts a cross-sectional view and a three-dimensional diagram of a memory cell according to an embodiment of the present invention, wherein 7(a) depicts a cross-sectional view of a memory cell while 7(b) depicts a three-dimensional diagram of the memory cell. As shown in FIG. 7, a substrate 310 may be a semiconductor substrate such as a silicon substrate, a silicon containing substrate, a III-V group-on-silicon (such as GaN-on-silicon) substrate, a graphene-on-silicon substrate, a silicon-on-insulator (SOI) substrate or a substrate containing epitaxial layers. Only an active area B of a substrate 310 is depicted, and an isolation structure 315 isolates the active area B from other areas. The isolation structure 315 may include a shallow trench isolation (STI) structure, which may be a shallow trench isolation (STI) process, but it is not limited thereto.

A third doped region 322 and a storage node contact 330 may be formed in the substrate 310. In this embodiment, the storage node contact 330 is located beside the third doped region 322, and is disposed right next to the third doped region 322, but it is not limited thereto. In a preferred embodiment, the storage node contact 330 is a metal silicide. Methods of forming the third doped region 322 and the storage node contact 330 may include the following, but it is not limited thereto.

Figure 8:
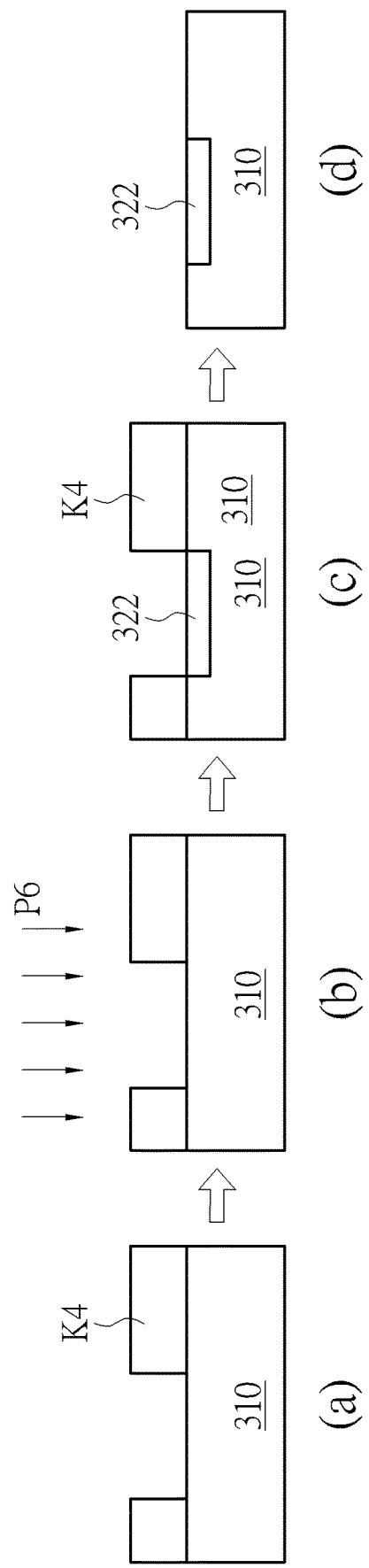
FIG. 8 schematically depicts a cross-sectional view of a method of forming a third doped region according to an embodiment of the present invention.

FIG. 8 schematically depicts a cross-sectional view of a method of forming a third doped region according to an embodiment of the present invention. As shown in FIG. 8 (a), a patterned mask K4 is formed on the substrate 310, and the part of the substrate 310 for having the third doped region 322 formed therein in later processes is exposed. As shown in FIGS. 8 (b)-8 (c), a doped process P6 is performed to form the third doped region 322. Thereafter, the patterned mask K4 is removed, as shown in FIG. 8 (d). In this way, the third doped region 322 can be formed only by the doped process.

Figure 9:
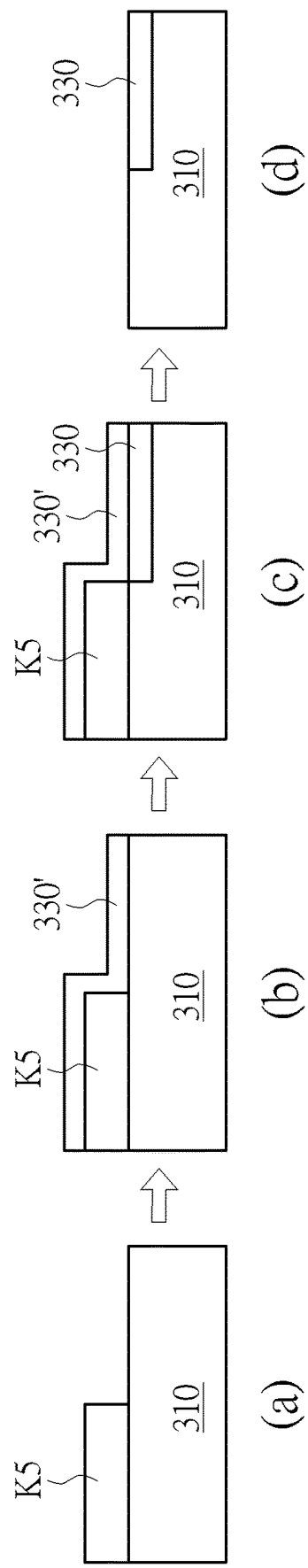
FIG. 9 schematically depicts a cross-sectional view of a method of forming a metal silicide according to an embodiment of the present invention.

FIG. 9 schematically depicts a cross-sectional view of a method of forming a metal silicide according to an embodiment of the present invention. As shown in FIG. 9 (a), a patterned mask K5 is formed on the substrate 310, and the part of the substrate 310 for having the storage node contact 330 (a metal silicide) formed therein in later processes is exposed. The patterned mask K5 may be a nitride layer or an oxide layer etc. As shown in FIGS. 9 (b)-9 (c), a metal layer 330' may entirely cover the patterned mask K5 and the substrate 310, wherein the metal layer 330' directly contacts the substrate 310 are reacted with the substrate 310 to form the storage node contact 330. Thereafter, the left part of the metal layer 330' is removed, as shown in FIG. 9 (d).

Accordingly, methods of forming the third doped region 322 and the storage node contact 330 are presented, and the forming orders may depend upon practical requirements. The third doped region 322 and the storage node contact 330 of the present invention can be formed in the substrate 310 only by the doped processes. This simplifies processes and reduces the damage of the substrate 310 occurs during processes.

As shown in FIG. 7, a second doped region 324 and a first doped region 326 stacked from bottom to top are formed on the third doped region 322. In this embodiment, the second doped region 324 and the first doped region 326 are disposed on the substrate 310, and the third doped region 322 is disposed in the substrate 310. Thereby, the third doped region 322, the second doped region 324 and the first doped region 326 constitute a vertical gate channel 320. In this embodiment, the first doped region 326 and the third doped region 322 have a first conductive type while the second doped region 324 has a second conductive type, wherein the first conductive type and the second conductive type have different conductive types. The first conductive type may be N-type while the second conductive type may be P-type. Instead, the first conductive type may be P-type while the second conductive type may be N-type. The vertical gate channel 320 of the present invention has a current C flowing downward. In other words, memory cells of the prior art including transistors having vertical gate channels all have currents flowing upward, and the memory cell of the present invention including a transistor includes a vertical gate channel having an inverse current.

Figure 10:
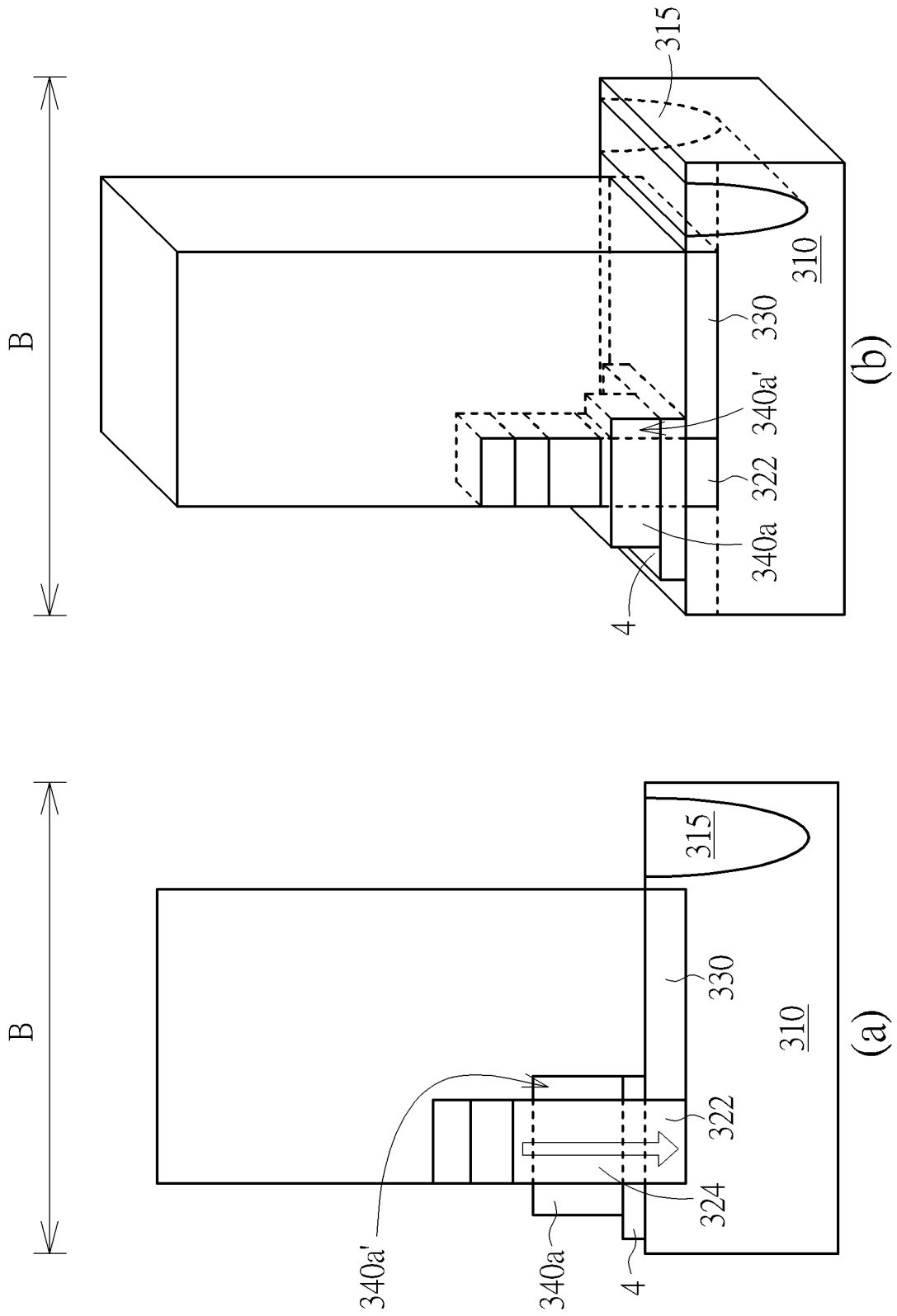
FIG. 10 schematically depicts a cross-sectional view and a three-dimensional diagram of a memory cell according to an embodiment of the present invention.

A word line 340 is formed on three sidewalls S3 of the second doped region 324. In this embodiment, the word line 340 is only formed on the three sidewalls S3 of the second doped region 324, thereby the word line 340 can be directly disposed on the substrate 310, but it is not limited thereto. In another embodiment, the word line 340a may surround the second doped region 324 as shown in FIG. 10, thereby the ability of the word line controlling the second doped region 324 can be better. Since a part 340a' of the word line 340a at the right side of the second doped region 324 is located above the storage node contact 330, a dielectric layer 4 is formed to electrically isolate the part 340a' of the word line 340a from the storage node contact 330. The dielectric layer 4 may be a nitride layer or an oxide layer etc. By doing this, the word line 340/340a of the present invention can be directly formed on the substrate 310 or the dielectric layer 4, therefore processes can being simplified and a formed structure can be more stable.

Please refer to FIG. 7 again, a bit line contact 352 and a bit line 354 are sequentially stacked above a transistor T2 having a vertical gate channel and are in electrical contact with the first doped region 326. The bit line contact 352 and the bit line 354 may be formed by metals such as copper, or aluminum etc, and the bit line contact 352 and the bit line 354 may have common or different conductive materials.

A capacitor 360 is formed beside the transistor T2 having the vertical gate channel and is in electrical contact with third doped region 322, wherein the capacitor 360 physically contacts the storage node contact 330. Therefore, the bit line 354 and the capacitor 360 are both located above the substrate 310. Preferably, the capacitor 360 entirely covers the space right above the transistor T2 having the vertical gate channel, the bit line contact 352 and the bit line 354, and the capacitor 360 has a volume as large as possible. By doing this, the capacitor 360 of the present invention can be disposed above the transistor T2 having the vertical gate channel stably and can be prevented from collapsing.

To summarize, the present invention provides a memory cell including a curved gate channel transistor, which includes a first doped region disposed in a substrate, s second doped region and a third doped region disposed on the substrate, thereby constituting a curved gate channel, and then a word line directly covering the second doped region. In this way, processes are simplified due to the first doped region, the second doped region and the third doped region are formed in/on the substrate directly. The word line directly covering the second doped region can improve the coverage of the word line covering the second doped region and the ability of the word line to control the curved gate channel. Besides, the memory cell of the present invention has a more stable structure, which can prevent the structure from being damaged caused by the collapse of a vertical structure.

The present invention also provides a memory cell including a vertical gate channel transistor including a third doped region, a second doped region and a first doped region from bottom to top, thereby constituting a vertical gate channel, wherein the first doped region and the second doped region are disposed on the substrate while the third doped region is disposed in the substrate. Beside, a bit line is disposed above a transistor having a vertical gate channel and is in electrical contact with the first doped region, and a capacitor is disposed next to the vertical gate channel transistor and is in electrical contact with the third doped region, thereby the vertical gate channel has a current flowing downward. By doing this, the memory cell has a more stable structure, which can reduce the structure damage caused by vertical structural collapse. Besides, the memory cell of the present invention can save space and improve the performance of the memory cell.

Moreover, the third doped region and a storage node contact (which may be a metal silicide) may be directly formed in the substrate. A word line is disposed on at least a sidewall of the second doped region, and is disposed directly on the substrate. Hence, these make processes easier.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory cell, comprising:
    a curved gate channel transistor having a first doped region located in a substrate, a second doped region located on the substrate and a third doped region located on the substrate, wherein the second doped region having a curved top surface is directly on the first doped region, the third doped region is right next to the second doped region, and only a sidewall of the third doped region contacts to the second doped region, thereby the first doped region, the second doped region and the third doped region constituting a curved gate channel;
    a buried bit line located below the first doped region;
    a word line covering the second doped region; and
    a capacitor located above the curved gate channel transistor and in electrical contact with the third doped region.

2. The memory cell according to claim 1, wherein the first doped region and the third doped region have a first conductive type while the second doped region has a second conductive type.

3. The memory cell according to claim 1, wherein the third doped region comprises a top part and a bottom part.

4. The memory cell according to claim 3, wherein the first doped region has a first conductive type, the second doped region has a second conductive type, and the top part has the first conductive type while the bottom part has the second conductive type.

5. The memory cell according to claim 3, wherein the first doped region has a first conductive type, the second doped region has a second conductive type, and the top part has the first conductive type while the bottom part is an un-doped part.

6. The memory cell according to claim 1, further comprising:
    a storage node contact physically contacting the capacitor and the third doped region, and the storage node contact electrically connecting the capacitor with the third doped region.

7. The memory cell according to claim 6, wherein the capacitor comprises a storage node and a storage node pad contacting the storage node with the storage node contact.

8. The memory cell according to claim 6, wherein the word line directly contacts the storage node contact.

9. The memory cell according to claim 1, further comprising:
    a bit line contact physically contacting the buried bit line and the first doped region, and the bit line contact electrically connecting the buried bit line with the first doped region.

10. The memory cell according to claim 1, further comprising:
    a dielectric layer covering the substrate but exposing the first doped region.

11. The memory cell according to claim 1, wherein interfaces between the second doped region and the word line are curved surfaces.

12. The memory cell according to claim 11, further comprising:
    a gate dielectric layer between the second doped region and the word line, thereby the gate dielectric layer being a curved layer.

* * * * *